United States Patent
Garcia et al.

(10) Patent No.: US 8,373,459 B2
(45) Date of Patent: Feb. 12, 2013

(54) POWER-ON RESET CIRCUIT

(75) Inventors: Santiago Iriarte Garcia, Valencia (ES); Johannes Gerber, Unterschleissheim (DE); Bernhard Wolfgang Ruck, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/005,264

(22) Filed: Jan. 12, 2011

(65) Prior Publication Data

US 2012/0286833 A1 Nov. 15, 2012

Related U.S. Application Data

(62) Division of application No. 12/247,398, filed on Oct. 8, 2008, now Pat. No. 7,893,734.

(51) Int. Cl.
*H03L 7/00* (2006.01)
(52) U.S. Cl. ............ 327/143; 327/78; 327/80; 327/541
(58) Field of Classification Search ............... 327/77–81, 327/142, 143, 198, 539, 541, 543
See application file for complete search history.

(56) References Cited

U.S. PATENT DOCUMENTS

| 7,893,734 B2 * | 2/2011 | Garcia et al. ............... 327/143 |
| 2005/0110533 A1 * | 5/2005 | Son ............................. 327/143 |

* cited by examiner

*Primary Examiner* — Long Nguyen
(74) *Attorney, Agent, or Firm* — Robert D. Marshall, Jr.; Wade James Brady, III; Frederick J. Telecky, Jr.

(57) ABSTRACT

An integrated circuit provides a power on reset signal with respect to a supply voltage level supplying the electronic device. The integrated circuit comprises a bias current generating stage having a first current mirror and an output stage having first, second and third series connected MOS transistors. A connection between the second MOS transistor and the third MOS transistor forms a POR output node. A gate of the second MOS transistor and a gate of the third MOS transistor are coupled to each other and to the first current mirror. This allows a current through the third MOS transistor when the supply voltage is higher than a first MOS transistor threshold and a current through the second MOS transistor only when the supply voltage is greater than or equal to the sum of the first MOS transistor threshold and a second MOS transistor threshold voltage.

3 Claims, 2 Drawing Sheets

POWER-ON RESET CIRCUIT

CLAIM OF PRIORITY

This application claims priority under 35 U.S.C. 119(a) to German Patent Application No. 10 2007 048 455.2 filed Oct. 10, 2007 and under 35 U.S.C. 119(e)(1) to U.S. Provisional Application No. 61/016,997 filed Dec. 27, 2007.

TECHNICAL FIELD OF THE INVENTION

The technical field of this invention is an electronic device with power-ON reset circuitry and more specifically to power-ON reset circuitry providing a power-ON reset signal with respect to a supply voltage level of the electronic device.

BACKGROUND OF THE INVENTION

When the power supply of an electronic device is switched on, typically not all parts of the electronic device will have a sufficient supply voltage level at the same time to start operating. The designer must provide a mechanism to which assure that the electronic device starts operating only when the supply voltage level is high enough. This monitoring and control function is performed by a power-ON reset circuit. U.S. Pat. No. 5,396,115 describes an example of a power-ON circuit. This prior art power-ON reset circuit is complex and has a power consumption too high for current low power applications.

SUMMARY OF THE INVENTION

It is an object of the present invention to provide an electronic device with a power-ON reset circuit which consumes less chip area and less power than prior art circuit.

Accordingly, the present invention is an electronic device including an integrated circuit providing a power on reset signal with respect to a supply voltage level of the electronic device. The integrated circuit includes a bias current generating stage. The bias current generating stage has a first current mirror. The circuit also includes an output stage having a first MOS transistor, a second MOS transistor and a third MOS transistor connected in series. The output stage has a power on reset (POR) output node between the second MOS transistor and the third MOS transistor. The gate of the second MOS transistor and the gate of the third MOS transistor are coupled to each other and to the first current mirror. This allows a current through the third MOS transistor when the supply voltage level of the integrated circuit is higher than a first MOS transistor threshold voltage level and allows a current through the second MOS transistor only when the supply voltage level is greater than or equal to the sum of the first MOS transistor threshold level and the second MOS transistor threshold voltage level. The bias current generating stage is connected to the supply voltage and has a current mirror adapted to generate a bias current. The output stage is coupled to the bias current generating stage and has an output node that provides the power-ON reset signal at a POR output node). This output node is situated between the second and third MOS transistors. Gate terminals of the second and third MOS transistors are interconnected and the bias current generating stage. Thus the first current mirror is connected to a node interconnecting the gates of the second and third MOS transistors. This arrangement allows current to flow through the third transistor when the supply voltage is greater than a first MOS transistor threshold voltage level. Current only flows through the second MOS transistor in the output stage when the supply voltage is greater than or equal to the first MOS transistor threshold level plus the second MOS transistor threshold voltage level.

The present invention is a circuit that provides a POR signal when the supply voltage level exceeds two threshold levels. These are an NMOS threshold voltage level and a PMOS threshold voltage level. The first threshold voltage level is determined within the bias current generating stage. The bias current generating stage starts operating only if the supply voltage exceeds the first threshold voltage level by producing a very small amount of bias current. A current mirror in the bias current generating stage needs at least a voltage drop of one first threshold voltage level. Accordingly, the bias current generating stage itself defines the first threshold. When a small amount of bias current is produced, the output stage is also fed with a mirrored version of the bias current. As a consequence, a current flows through the third MOS transistor and the POR output node settles to ground level. With a very small supply voltage level just above the first threshold voltage level (for example the NMOS threshold voltage of typical CMOS technology), the POR output node has a defined state and the POR output signal is defined. If the supply voltage is further increased to a supply voltage level which is equal to the sum of the first threshold voltage level and a second threshold voltage level (for example the PMOS threshold voltage level of the CMOS technology), the second MOS transistor in the output stage conducts and a current flows through the channels of the first, second and third MOS transistors. Thus the second threshold level is determined in the output stage by the second MOS transistor. Since the gate of the second MOS transistor is coupled to the current mirror in the current generating stage, the current mirror and the second MOS transistor together set a combined voltage drop equal to the sum of a first and a second threshold voltage level (for example the sum of an NMOS and PMOS threshold voltage level) before both transistors carry current. Once the current flows through the output stage, the first MOS transistor also conducts. If the first MOS transistor is dimensioned to provide slightly more current than the third MOS transistor can sink, the voltage level at the POR output node will rise. Thus the POR output signal changes from LOW to HIGH if the supply voltage level is higher than two CMOS threshold voltage levels. The electronic circuit of the present invention saves a considerable amount of current and chip area because the bias current generating stage contributes the first MOS threshold voltage level to the entire operation. This is then combined with another MOS threshold level of a MOS transistor in the output stage. This combination and the interaction of bias current stage and output stage makes this invention more power efficient and smaller in chip area than conventional circuits. The bias current generating stage consumes only a very small amount of power and the whole circuit requires only a little extra power above that required for the output stage. Therefore the present invention provides an electronic device with a power-ON reset circuit that is ultra-low power and also saves space on the integrated circuit.

In one aspect of the invention, the first current mirror comprises a diode connected MOS transistor device, which includes a plurality of MOS transistors connected in series. A fourth MOS transistor is coupled with a gate to the POR output node and in parallel to at least one of the series of MOS transistors of the diode connected MOS transistor device to reduce the bias current when the voltage level of the POR output node is greater than or equal to the first MOS transistor threshold voltage level. The first current mirror includes a plurality of series-connected MOS transistors connected in parallel to the fourth MOS transistor in the output stage. The gate terminal of the fourth MOS transistor is connected to the output node that provides the power-ON reset signal. When the voltage at the POR output node is greater than or equal to the first MOS transistor threshold level, the fourth MOS transistor conducts and at least one transistor of the plurality of MOS transistors is bypassed by the fourth MOS transistor. This however, influences the bias current generating stage and reduces the bias current generated in the bias current stage in response to the voltage level of the POR output node.

The consequence is that the POR circuit of this invention provides a hysteresis. Only if the voltage level at the POR output node exceeds the sum of the two MOS threshold voltage levels, the POR output becomes high and the bias current from the bias current generating stage is adapted. However, when the supply voltage level drops again, the reduced bias current from the bias current generating stage provides that the voltage level at the POR output node must reach a level that is lower than with a rising supply voltage. Again, the output stage interacts directly with the bias current generating stage and this saves power and chip area and provides a very small and efficient circuit.

The basic principle of the hysteresis could be understood as follows. The third transistor and the first transistor operate as two competing current sources. The POR output node has a high impedance node. The third transistor conducts before the first transistor. However, the first transistor sources more current than the third transistor, when both transistors are substantially conductive. With a rising supply voltage, there will be a point, where the first transistor conducts sufficiently (drain-source and gate-source voltages are increasing and the second transistor is also conductive) to provide the respective current. As the third transistor can not sink the same amount of current, the voltage level at the POR output node rises. Finally, the voltage level at the POR output node will reach the supply voltage level, thereby turning the first transistor off when the drain-source voltage of the first transistor becomes too small. If the fourth transistor is conducts, the bias current generating stage reduces the bias current. This moves the trip point to a lower supply voltage level, where the voltage level at the POR output node switches. Accordingly, if the supply voltage drops, the first transistor will be able to source the smaller current even with a smaller supply voltage level than for a rising supply voltage, when the fourth transistor is not conductive.

The plurality of MOS transistors of the current mirror may include MOS transistors having the same width to length ratio. The third transistor may include a plurality of MOS unit transistors coupled in series, which are matched with the MOS transistors of the current mirror. All of the transistors forming the current mirror stage thus have the same width to length ratio. The third MOS transistor in the output stage may be formed of several transistors connected in series. This allows the third transistor to be easily matched with the series-connected MOS transistors in the current mirror stage. Matching the transistors in this way allows implementation of a precise ratio of currents.

Preferably, the current mirror comprises a fifth MOS transistor coupled to a gate of diode connected MOS transistor device. This fifth MOS transistor preferably comprises two MOS transistors coupled in series. The diode connected MOS transistor device of the current mirror preferably comprises four MOS transistors. The third MOS transistor includes three MOS transistors. The fourth MOS transistor is coupled in parallel to one MOS transistor of the diode connected MOS transistor device. The current mirror stage can also have an additional fifth transistor having its gate terminal interconnected with that of the diode connected MOS transistor device. In fact the fifth transistor may comprise two MOS transistors connected in series with each other, both of which can be transistors having the same width to length ratio. Four series connected MOS transistors can then be used to form the diode connected MOS transistor device of the current mirror stage. The third MOS transistor in the output stage can be three transistors each having the same width to length ratio. The fourth MOS transistor in the output stage is then connected in parallel with one of the transistors forming the diode connected MOS transistor device.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
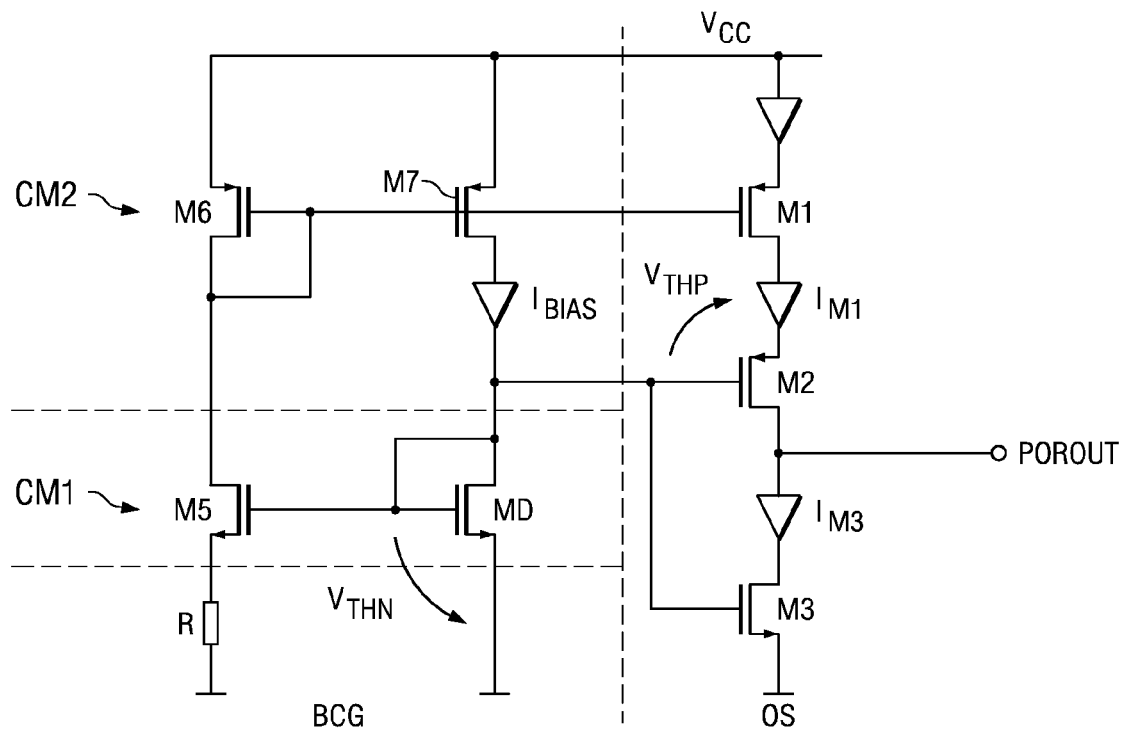
FIG. 1 is a simplified circuit diagram of an electronic device comprising power-ON reset circuitry according to a first embodiment of the invention.

FIG. 1 shows a device according to a first embodiment of the invention. Bias current generating stage BCG has first current mirror CM1 which includes diode connected NMOS transistor MD and transistor M5. Resistor R is coupled between the source of transistor M5 and ground. First current mirror CM1 is coupled to second current mirror CM2. The second current mirror includes PMOS transistor M6 with a gate terminal connected to the gate terminal of PMOS transistor M7. Source terminals of transistors M6 and M7 in bias current generating stage BCG are connected to the supply voltage rail Vcc. Transistors M6 and M7 form second current mirror CM2. Bias current generating stage BCG has a typical bias current generating stage configuration. Output stage OS is connected between the supply voltage rail Vcc and ground. Output stage OS is also coupled to bias current generating stage BCG. The output stage OS included first PMOS transistor M1 having a gate terminal connected to the interconnection of the gates of transistors M6 and M7 in current mirror CM2 and second PMOS transistor M2 connected in series with transistor M1 and having its gate terminal connected to the output of bias current stage BCG at the drain terminal of transistor M7. NMOS transistor M3 is connected in series with transistors M1 and M2 and has its gate terminal connected to the gate of transistor M2 and current mirror CM1 of bias current generating stage BCG. Output stage OS has a power on reset output node POROUT at a connection of the drain terminals of transistors M2 and M3. A connection of the gate of transistor M5 and the gate and drain terminals of transistor MD of the bias current generating stage BCG is connected to the drain of transistor M7 in second current mirror CM2 and also the gate terminals of transistors M2 and M3 in output stage OS. The source terminal of transistor MD is connected directly to ground and the source terminal of transistor M5 is connected to ground via resistor R. The drain terminal of transistor M5 is connected to that of diode connected transistor M6 in second current mirror CM2.

In operation, when the supply voltage Vcc is less than the threshold voltage VTHN of transistor MD in bias current generating stage BCG and less than the threshold voltage VTHP of transistor M2 in output stage OS (Vcc<VTHN and Vcc<VTHP), the circuit does not operate and the output at output node POROUT is low.

When the supply voltage Vcc is lower than the sum of the threshold voltage VTHN of transistor MD in bias current generating stage BCG and the threshold voltage VTHP of transistor M2 in output stage OS, but greater than the threshold voltage VTHN of transistor MD in bias current generating stage BCG and greater than the threshold voltage VTHP of transistor M2 in output stage OS by themselves (Vcc<(VTHN+VTHP) and Vcc>VTHN and Vcc>VTHP), bias generating stage BCG generates a current Ibias. Because the supply voltage Vcc is not high enough, the gate-source voltage of PMOS transistor M2 in output stage OS, which operates as a switch, is lower than the threshold voltage VTHP of transistor M2 and transistor M2 is turned OFF. Transistor M3 is switched ON, due to the bias current Ibias applied to its gate terminal and tries to mirror current. A small amount of current may be mirrored to transistor M1, via transistors M6 and M7 but transistor M2 still does not conduct and the current is less then current sourced by transistor M3. In this situation transistor M3 draws more current than transistors M1 and M2 can provide. Thus output node POROUT remains at ground level.

When the supply voltage Vcc becomes greater than the sum of the threshold voltage VTHN of transistor MD in bias current generating stage BCG and the threshold voltage VTHP of transistor M2 in output stage OS (Vcc>(VTHN+VTHP)), transistor M2 in output stage OS switches ON. This transistor M1, which acts as a current source, provides more current to output node POROUT. Transistor M3 is dimensioned so that it generates current output stage OS lower than the current supplied to output node POROUT by transistor M1. This is preferably by a factor of 4. This causes the voltage at output node POROUT to be pulled to supply voltage level Vcc generating a power-ON reset signal at output node POROUT. The whole circuit has only three branches, two for bias current generator BCG and one for output stage OS. This makes the circuit extremely power and area efficient. The direct interaction between bias current generating stage BCG comprising transistors MD, M5, M6, M7 and resistor R and output stage OS including transistors M3, M1 and M2 provides a highly efficient solution for a POR circuit.

Figure 3:
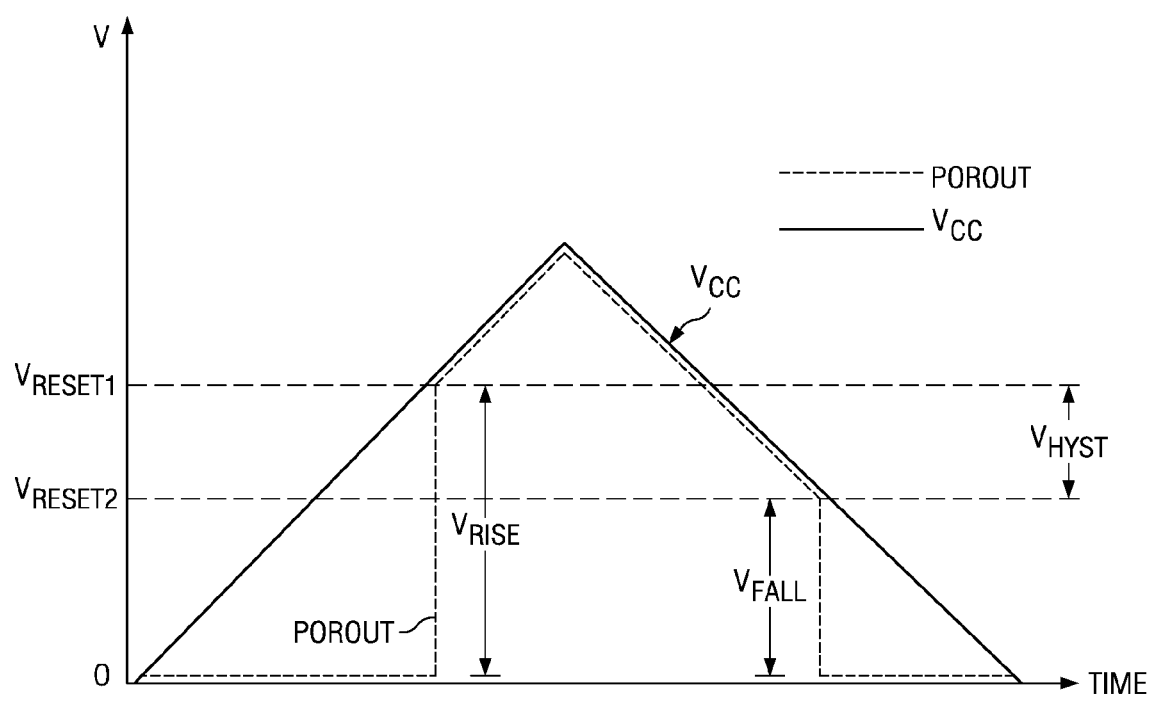
FIG. 3 is a graph of the positive supply voltage as a function of time showing the reset voltages in an electronic device according to the second embodiment of the invention.
Figure 2:
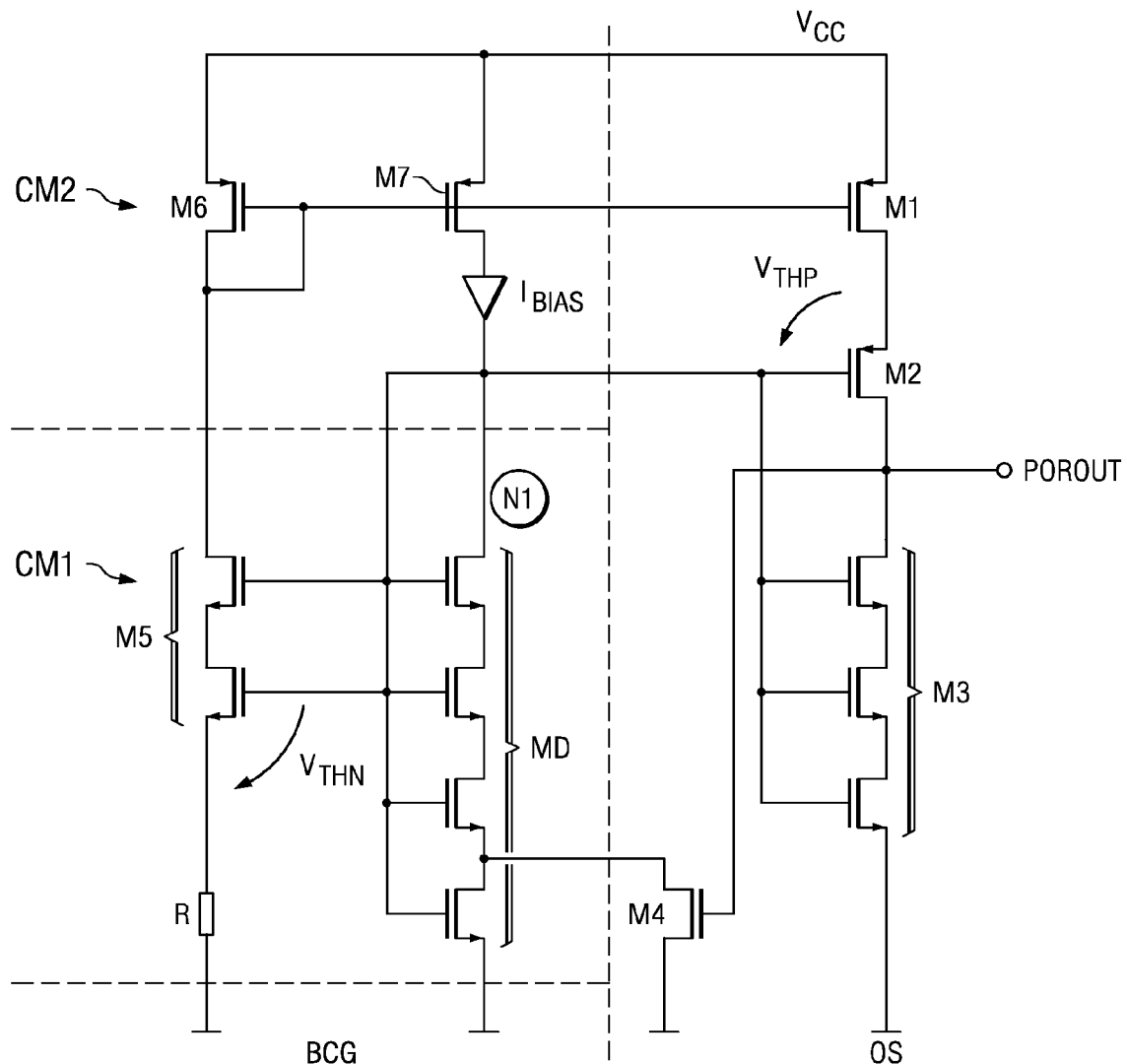
FIG. 2 is a simplified circuit diagram of an electronic device comprising power-ON reset circuitry according to a second embodiment of the invention.

FIG. 2 illustrates a second embodiment of the invention. The circuit of FIG. 2 is almost the same as FIG. 1, except that the diode connected transistor MD in bias current generating stage BCG of FIG. 1 is formed of four series-connected unit NMOS transistors with interconnected gate terminals in FIG. 2. Transistor M5 of FIG. 1 is formed of two unit series-connected NMOS transistors with interconnected gate terminals in FIG. 2. Transistor M3 in output stage OS of FIG. 1 is formed of three series-connected unit NMOS transistors having interconnected gate terminals in FIG. 2. These unit transistors all have the same width to length ratio. This means that they can easily be matched with each other and other transistors in current mirrors CM1 and CM2 having the same unit transistors. An additional NMOS transistor M4 has its gate terminal connected to POR output node POROUT and is connected in parallel to one of the series-connected NMOS transistors forming transistor MD in bias current generating stage BCG. Transistor M4 reduces the bias current Ibias in bias current generating stage BCG when the voltage level of POR output node POROUT is or greater than or equal to the threshold voltage level VTHN of transistor MD. Connecting transistor M4 in parallel with at least one of the series-connected transistors forming transistor MD and coupling the gate terminal of transistor M4 to output node POROUT, causes the gate voltage of transistor MD (node N1) to depend on the voltage at the output node POROUT. This configuration provides a hysteresis in the POR output signal. Different first and second reset voltage levels VRESET1 and VRESET2 are provided when the power supply voltage Vcc raises or drops. FIG. 3, which is a graph of the supply voltage Vcc as a function of time, illustrates this hysteresis.

Transistors M1 and M3 operate as current sources and they source and sink current in a competing manner. The POR output node is therefore a high impedance node. For a rising supply voltage Vcc, third transistor M3 conducts before first transistor M1. Therefore, the POR output node is pulled down to ground. However, first transistor M1 sources more current than third transistor M3 can sink ($I_{M3} < I_{M1}$) when both transistors M1 and M3 conduct and transistor M2 is switched ON. If supply voltage Vcc is high enough, first transistor M1 conducts (drain-source and gate-source voltages are increasing and second transistor M2 also conducts) providing current $I_{M1}$. As third transistor M3 can not sink this amount of current, the voltage level at POR output node rises. Finally, the voltage level at POR output node will reach the supply voltage level Vcc, thereby turning the first transistor M1 OFF when the drain-source voltage becomes too small. The trip point is as VRESET1. If POROUT is high, fourth transistor M4 conducts and bias current Ibias from bias current generating stage BCG is reduced. This moves the trip point where POROUT node switches from high to low to a lower supply voltage level Vcc=VRESET2. Accordingly, if supply voltage Vcc drops, first transistor M1 will still be able to source the smaller current down to a smaller supply voltage level Vcc=VRESET2 than for a rising supply voltage Vcc, when the fourth transistor M4 does not conduct. A conducting transistor M4 reduces Ibias and also $I_{M3}$. Therefore, the condition $I_{M1} > I_{M3}$ is maintained even for smaller supply voltage levels.

The ratio between the transistors MD and M5 is higher when the output is low. It is a factor of 2 rather than a factor of 1.5 when the output is high. When the output is low there are effectively four transistors in series in transistor MD compared to three when the output is high. This decreases the effective width to length ratio of transistor MD and increases its gate voltage. The two trip points VRESET1 and VRESET2 are: $VGSN_{(rise)} + VTHP = VRISE$; and $VGSN_{(fall)} + VTHP = VFALL$; where VGSN is the gate-source voltage of transistor MD. The difference between reset signals VRESET1 and VRESET2 is then the hysteresis voltage VHYST. The output signal POR output node POROUT is illustrates in FIG. 3 by a dashed line.

Although the present invention has been described with reference to specific embodiments, it is not limited to these embodiments and no doubt further alternatives will occur to the skilled person that lie within the scope of the invention.

What is claimed is:

1. An integrated circuit providing a power on reset (POR) signal with respect to a supply voltage comprising:
  a bias current generating (BCG) stage generating a bias current (Ibias), including
    a first MOS transistor (M7) having a source connected to a first voltage source (Vcc), a gate and a drain,
    a first diode connected MOS transistor device (MD) having a plurality of MOS transistors connected in series having a drain and common gates connected to said drain of said first MOS transistor (M7) and a source connected to a second voltage source (OS),
    a second diode connected MOS transistor (M6) having a source connected to said first voltage source (Vcc) and a commonly connected gate and drain, a second MOS transistor (M5) having a drain connected to said commonly connected gate and drain of said second diode connected MOS transistor (M6), a source, and a gate connected to said drain of said first MOS transistor (M7), a resistor connected between said source of said second MOS transistor (M5) and said second voltage source (OS), a third MOS transistor (M4) having a gate connected to a POR output node (POROUT) and a source-drain path connected in parallel with at least one of said plurality of MOS transistors of said first diode connected MOS transistor device (MD); and an output stage (OS) having a fourth MOS transistor (M1) having a source connected to a said first voltage source (Vcc), a gate connected to said gate of said first MOS transistor (M7) and a drain, a fifth MOS transistor (M2) having a source connected to said drain of said fourth MOS transistor (M1), a gate connected to said drain of said first MOS transistor (M7) and a drain connected to said POR output node (POROUT), and a sixth MOS transistor (M3) having a drain connected to said drain of said fifth MOS transistor (M2), a gate connected to said gate of said fifth MOS transistor (M2), and a source connected a second voltage source (OS).

2. The electronic device according to claim 1, wherein:

said plurality of MOS transistors of said first diode connected MOS transistor device (MD) includes a first plurality of MOS unit transistors, each MOS unit transistor having a same width to length ratio; and said sixth transistor (M3) of said output stage (OS) includes a second plurality of MOS unit transistors connected in series.

3. The electronic device according to claim 2, wherein:

said second MOS transistor (M5) includes two MOS unit transistors connected in series;

said plurality of MOS transistors of said first diode connected MOS transistor device (MD) comprises four MOS unit transistors;

said sixth MOS transistor (M3) comprises three MOS unit transistors; and said third MOS transistor (M4) is coupled in parallel to one of said plurality of MOS unit transistor of the first diode connected MOS transistor device (MD).

* * * * *